(12) United States Patent
Zhuang et al.

(10) Patent No.: US 6,939,724 B2
(45) Date of Patent: Sep. 6, 2005

(54) METHOD FOR OBTAINING REVERSIBLE RESISTANCE SWITCHES ON A PCMO THIN FILM WHEN INTEGRATED WITH A HIGHLY CRYSTALLIZED SEED LAYER

(75) Inventors: Wei-Wei Zhuang, Vancouver, WA (US); Tingkai Li, Vancouver, WA (US); David R. Evans, Beaverton, OR (US); Sheng Teng Hsu, Camas, WA (US); Wei Pan, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/640,770

(22) Filed: Aug. 13, 2003

(65) Prior Publication Data

US 2005/0037520 A1 Feb. 17, 2005

(51) Int. Cl.[7] ................................................ H01L 21/00
(52) U.S. Cl. ............................ 438/3; 438/654; 257/295
(58) Field of Search ..................... 438/3, 240, 761–763, 438/785, 957, 644, 654; 257/295, 635–642

(56) References Cited

U.S. PATENT DOCUMENTS 6,204,139 B1   3/2001   Liu et al.
6,473,332 B1 * 10/2002   Ignatiev et al. ............. 365/148
2003/0148545 A1 * 8/2003   Zhuang et al. ................. 438/3

OTHER PUBLICATIONS

Liu et al., *Electric–pulse–induced reversible resistance change effect in magnetoresistive films*, Applied Physics Letters, vol. 76, No. 19; May 8, 2000, pp 2749–2751.

* cited by examiner

*Primary Examiner*—David Nelms
*Assistant Examiner*—Calvin Lee
(74) *Attorney, Agent, or Firm*—David C. Ripma; Joseph P. Curtin

(57) ABSTRACT

A method for obtaining reversible resistance switches on a PCMO thin film when integrated with a highly crystallized seed layer includes depositing, by MOCVD, a seed layer of PCMO, in highly crystalline form, thin film, having a thickness of between about 50 Å to 300 Å, depositing a second PCMO thin film layer on the seed layer, by spin coating, having a thickness of between about 500 Å to 3000 Å, to form a combined PCMO layer; increasing the resistance of the combined PCMO film in a semiconductor device by applying a negative electric pulse of between about −4V to −5V, having a pulse width of between about 75 nsec to 1 μsec; and decreasing the resistance of the combined PCMO layer in a semiconductor device by applying a positive electric pulse of between about +2.5V to +4V, having a pulse width greater than 2.0 μsec.

10 Claims, 2 Drawing Sheets

METHOD FOR OBTAINING REVERSIBLE RESISTANCE SWITCHES ON A PCMO THIN FILM WHEN INTEGRATED WITH A HIGHLY CRYSTALLIZED SEED LAYER

FIELD OF THE INVENTION

This invention relates to a method of fabricating PCMO thin films via spin-coating on a highly crystallized PCMO seed layer which is deposited by MOCVD. The PCMO thin film has stable reversible resistance switch properties using negative nanoseconds short electric pulses to write the resistance to a high state and using positive microseconds long electric pulses to reset the resistance to a low state.

BACKGROUND OF THE INVENTION $Pr_{0.3}CA_{0.7}MnO_3$ (PCMO) metal oxide thin films, which show reversible resistance change via applying electric pulse, ware grown on both epitaxial $YBa_2Cu_3O_7$ (YBCO) and partial epitaxial platinum substrates via pulsed laser ablation (PLA) technique as described by Shangqing Liu et al., in Electric-pulse-induced reversible resistance change effect in magnetoresistive films, Applied Physics Letters, Vol. 76, number 19, pp. 2749. May 2000; and in U.S. Pat. No. 6,204,139 B1, granted Mar. 20, 2001, for Method for switching the properties of perovskite materials used in thin film resistors. In U.S. Pat. No. 6,673,691 B2, granted Jan. 6, 2004, for Method for Reversible Resistance Change induced by Short Electric Pulses, a method of spin-coating PCMO thin film deposition technique is described to fabricate a reversible resistance switch using a unipolar electric pulse. In co-pending U.S. patent application Ser. No. 10/377,244, filed Feb. 27, 2003, for Precursor Solution and Method for Controlling the Composition of MOCVD Deposited PCMO, a PCMO thin film, having reversible resistance properties, is formed by MOCVD.

Liu et al., supra, discovered a resistance change in a PCMO film by applying bipolar electric pulses at room temperature, specifically for a $Pr_{0.3}Ca_{0.7}MnO_3$ (PCMO) thin film. Liu et al. deposited PCMO thin films on epitaxial $YBa_2Cu_3O_7$ (YBCO) and on partial epitaxial platinum substrates by pulsed laser deposition (PLD).

SUMMARY OF THE INVENTION

A method for obtaining reversible resistance switches on a PCMO thin film when integrated with a highly crystallized seed layer includes depositing, by MOCVD, a seed layer of PCMO, in highly crystalline form, thin film, having a thickness of between about 50 Å to 300 Å, depositing a second PCMO thin film layer on the seed layer, by spin coating, having a thickness of between about 500 Å to 3000 Å, to form a combined PCMO layer; increasing the resistance of the combined PCMO film in a semiconductor device by applying a negative electric pulse of about −4V to −5V, having a pulse width of between about 75 nsec to 1 $\mu$sec; and decreasing the resistance of the combined PCMO layer in a semiconductor device by applying a positive electric pulse of about +2.5V to +4V, and a pulse width greater than 2 $\mu$sec.

It is an object of the invention to provide a method of forming a PCMO thin film which exhibits reversible resistance switching properties by application of negative, nanosecond-long, electric pulses to write the resistance to a high state and application of positive, microsecond-long electric pulses to reset the resistance to a low state.

Another object of the invention is to provide a method of fabricating a PCMO film using a combination of spin-coating and MOCVD.

A further object of the invention is to provide a method of fabrication of a PCMO film by forming a thin seed layer and forming a thicker layer on the seed layer.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The $Pr_{0.3}Ca_{0.7}MnO_3$ (PCMO) thin film formation using the method of the invention requires two deposition steps. The method of the invention fabricates a PCMO thin films using a combination of spin-coating and MOCVD. Initially, a thin seed PCMO layer is deposited by MOCVD to produce a highly crystallized structure, and then, on the seed layer, a thick PCMO thin film is grown by a spin-coating process.

During the first step, the MOCVD process, a single-liquid PCMO precursor solution is used, following the deposition process described in the above-identified co-pending patent application for Method to form PCMO thin film using MOCVD process, which is incorporated herein by reference. The PCMO thin film deposited using the MOCVD process is a thin seed layer, having a thickness in the range of between about 50 Å to 300 Å. This seed, or first PCMO, layer is a highly crystallized PCMO structure. A high temperature post-annealing step may be applied to enhance the switching and stability properties of this highly crystallized, seed layer, e.g., annealing at a temperature of between about 500° C. to 650° C., for between about 10 minutes 120 minutes in an oxygen atmosphere.

In the second step of the method of the invention, a thicker, e.g., having a thickness of between about 500 Å and 3000 Å, PCMO thin film is deposited on the seed layer, using a spin-coating process, such as is described in the co-pending patent application, entitled Method for Reversible Resistance Change Induced by Short Electric Pulses, which is also incorporated herein by reference. The finished, or combined, PCMO thin film exhibits reversible resistance switching properties, as shown in FIGS. 1, 2 and 4, and is used as part of a semiconductor device.

Figure 1:
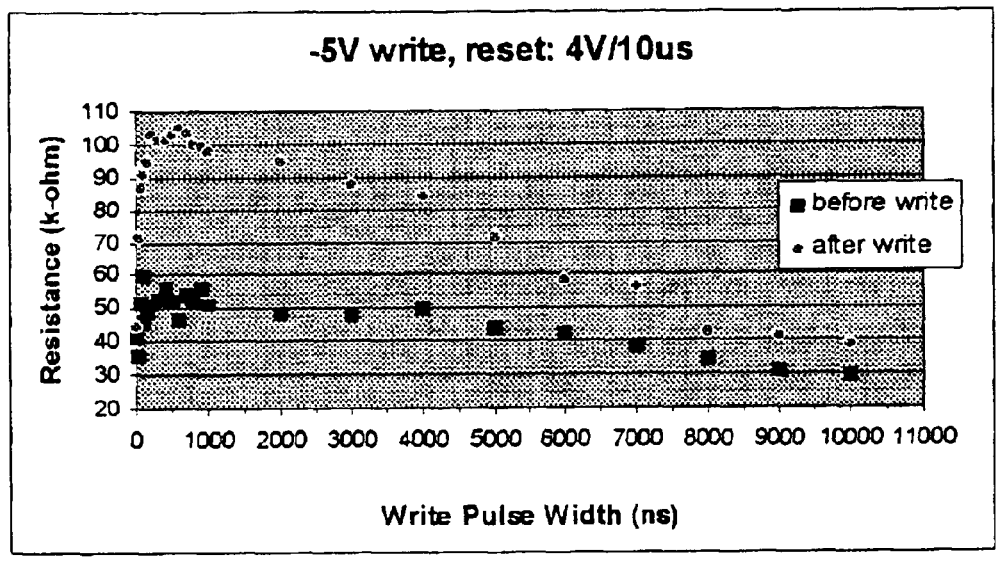
FIGS. 1 and 2 depict use of a negative pulse to write, or increase resistance, to a PCMO thin film.
Figure 2:
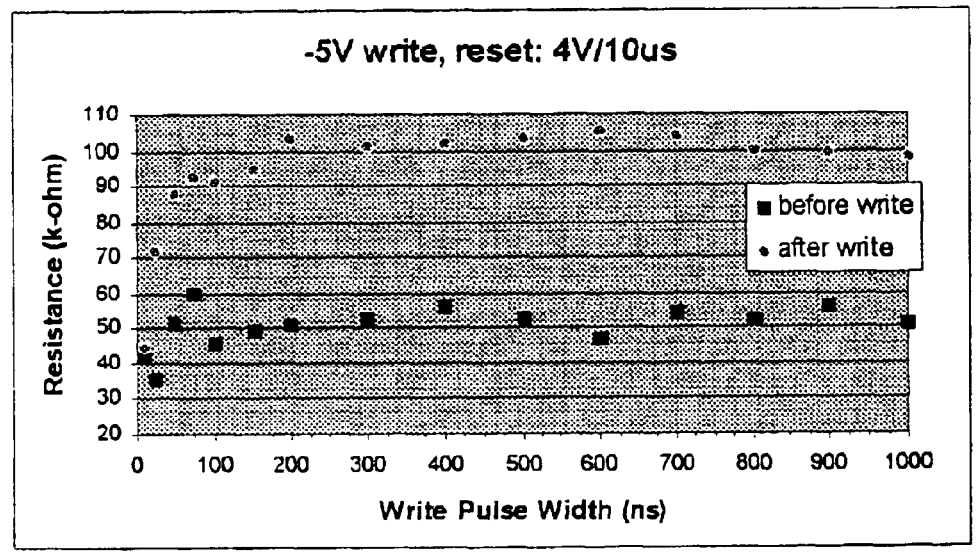

To write, or increase the resistance, to a high state, negative pulses are applied, as shown in FIGS. 1 and 2. For a pulse voltage of about −5V, a stable reversible resistance switch is achieved for a pulse width in the range of between about 75 nsec to 1 $\mu$sec. The increase in resistance is less when a negative pulse width longer than 1 $\mu$sec is applied. A positive nanosecond-long pulse has been discovered to lead to an unstable reversible resistance change, with only small increases in resistivity.

Figure 3:
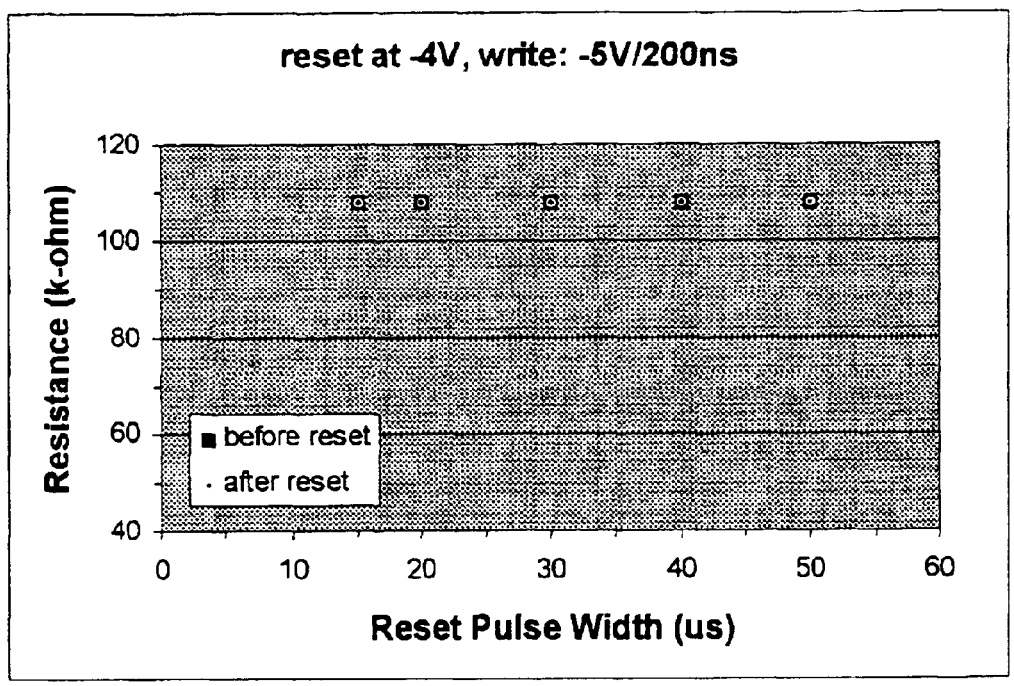
FIG. 3 depicts an attempt to use a negative pulse to reset a PCMO thin film.
Figure 4:
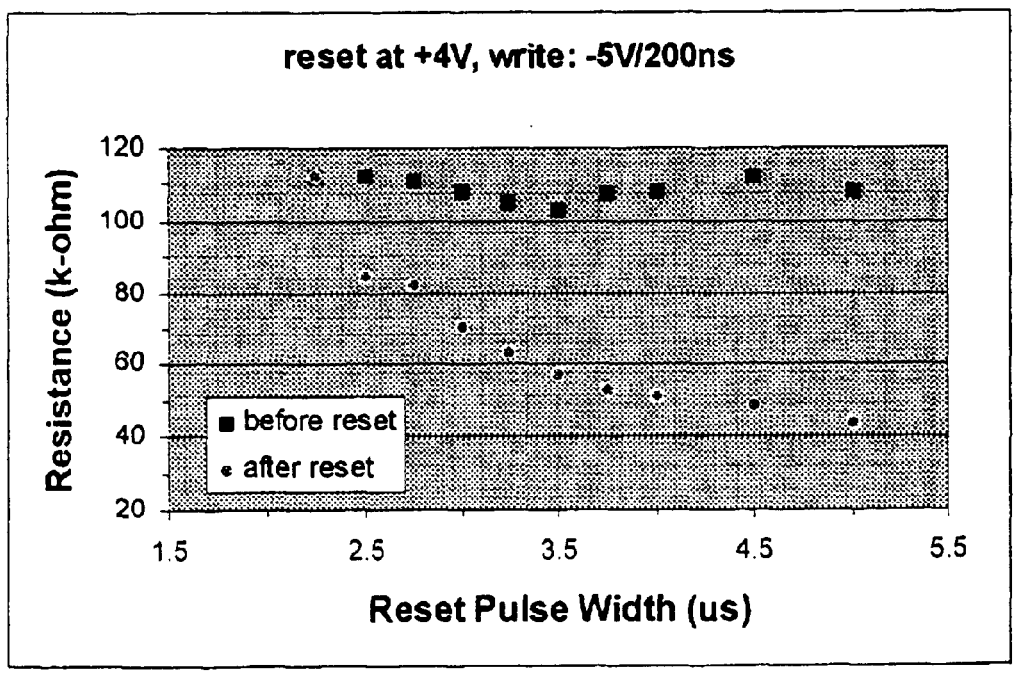
FIG. 4 depicts use of a positive pulse to reset, or decrease resistance, to a PCMO thin film.

To reset, or decrease the resistance, to a low state, a positive microsecond-long electric pulse is applied to the PCMO thin film, as shown in FIG. 4. The resistance can be decreased from its high state when a positive pulse of about 4V, having a pulse width greater than 2.5 μsec. is applied, and has been found to reach its lowest resistance state when the 4V positive pulse width is greater than 3.75 μsec. The use of the positive and negative pulse as resulting in optimal performance is confirmed, as shown in FIG. 3, wherein a negative pulse was used in an attempt to reset the PCMO thin film, which resulted in no resistance change when the negative pulse voltage was −4V, and only a small resistance decrease is found when a −5V negative pulse voltage is applied.

Thus, using the method of the invention to form a PCMO, highly crystalline, thin film, of between about 50 Å to 300 Å, by MOCVD, and depositing a thicker PCMO layer thereon, having a thickness of between about 500 Å to 3000 Å, by spin coating, the resistance of the resulting PCMO layer may be increased by application of a negative pulse of about −5V, having a pulse width of between about 75 nsec to 1 μsec; and the PCMO layer may be reset by application of a positive voltage of about +4V, having a pulse width greater than 2.5 μsec.

Thus, a method for obtaining reversible resistance switches on a PCMO thin film when integrated with a highly crystallized seed layer has been disclosed. It will be appreciated that further variations and modifications thereof may be made within the scope of the invention as defined in the appended claims.

We claim:

1. A method for obtaining reversible resistance switches on a PCMO thin film when integrated with a highly crystallized seed layer, comprising:

depositing, by MOCVD, a seed layer of highly crystalline PCMO thin film, having a thickness of between about 50 Å to 300 Å, depositing a second polycrystalline PCMO thin film layer on the seed layer, by spin coating, having a thickness of between about 500 Å to 3000 Å, to form a combined PCMO thin film layer;

increasing the resistance of die combined PCMO thin film layer in a semiconductor device by applying a negative electric pulse; and decreasing the resistance of the combined PCMO thin film layer in a semiconductor device by applying a positive electric pulse.

2. The method of claim 1 wherein said increasing the resistance of the combined PCMO thin film layer in a semiconductor device by applying a negative electric pulse includes applying an electric pulse of between about −4V to 5V, having a pulse width of between about 75 nsec to 1 μsec.

3. The method of claim 1 where said decreasing the resistance of the combined PCMO thin film layer in a semiconductor device by applying a positive electric pulse includes applying an electric pulse of between about +2.5V to +4V, having a pulse width greater than 2.0 μsec.

4. The method of claim 1 which includes post-annealing at high temperature of the combined PCMO thin film layer to enhance the switching and stability properties of the highly crystallized layer, including annealing at a temperature of between about 500° C. to 650° C., for between about 10 minutes to 120 minutes.

5. A method for obtaining reversible resistance switches on a PCMO thin film when integrated with a highly crystallized seed layer, comprising:

depositing a seed layer of PCMO thin film by MOCVD;

depositing a second polycrystalline PCMO thin film layer on the seed layer by spin coating wherein the thickness of a combined PCMO thin film layer is between about 500 Å to 3000 Å;

writing to the combined PCMO thin film layer in a semiconductor device by applying a negative electric pulse of between about −4V to −5V, having a pulse width of between about 75 sec to 1 μsec; and resetting the combined PCMO thin film layer in a semiconductor device by applying a positive electric pulse of between about +2.5V to +4V, having a pulse width greater than 2.0 μsec.

6. The method of claim 5 wherein said depositing a seed layer of PCMO includes depositing a seed layer of PCMO by MOCVD in highly crystalline form having a thickness of between about 50 Å to 300 Å.

7. The method of claim 5 wherein said depositing a second PCMO thin film layer on the seed layer includes depositing a second PCMO thin film by spin coating having a thickness of between about 500 Å to 3000 Å.

8. The method of claim 5 which includes post-annealing at high temperature of the combined PCMO thin film layer to enhance the switching and stability properties of the highly crystallized layer, including annealing at a temperature of between about 500° C. to 650° C., for between about 10 minutes to 120 minutes in an ambient atmosphere.

9. A method for obtaining reversible resistance switches on a PCMO thin film when integrated with a highly crystallized seed layer, comprising:

depositing, by MOCVD, a seed layer of highly crystalline PCMO having a thickness of between about 50 Å to 300 Å, depositing a second polycrystalline PCMO thin film layer on the seed layer, by spin coating, having a thickness ten times that of the highly crystalline seed layer to form a combined PCMO thin film layer;

increasing the resistance of the combined PCMO thin film layer in a semiconductor device by applying a negative electric pulse of between about −4V to −5V, having a pulse width of between about 75 nsec to 1 μsec; and decreasing the resistance of the combined PCMCO thin film layer in a semiconductor device by applying a positive electric pulse of between about +2.5V to +4V, having a pulse width greater than 2.0 μsec.

10. The method of claim 9 which includes post-annealing at high temperature of the combined PCMO thin film layer to enhance the switching and stability properties of the highly crystallized layer, including annealing at a temperature of between shout 500° C. to 650° C., for between about 10 minutes to 120 minutes.

* * * * *